United States Patent
Park et al.

(10) Patent No.: US 9,553,197 B2
(45) Date of Patent: Jan. 24, 2017

(54) THIN FILM TRANSISTOR AND DISPLAY DEVICE INCLUDING THE SAME

(71) Applicant: SAMSUNG DISPLAY CO., LTD., Yongin-si (KR)

(72) Inventors: Joon Seok Park, Yongin-si (KR); Bosung Kim, Seoul (KR); Changjung Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 14/931,172

(22) Filed: Nov. 3, 2015

(65) Prior Publication Data
US 2016/0329432 A1 Nov. 10, 2016

(30) Foreign Application Priority Data
May 4, 2015 (KR) .......................... 10-2015-0062422

(51) Int. Cl.
| | | |
|---|---|---|
| H01L 29/10 | (2006.01) | |
| H01L 29/786 | (2006.01) | |
| H01L 29/66 | (2006.01) | |
| H01L 27/12 | (2006.01) | |

(52) U.S. Cl.
CPC ..... *H01L 29/78648* (2013.01); *H01L 27/1222* (2013.01); *H01L 27/1225* (2013.01); *H01L 29/6675* (2013.01); *H01L 29/66742* (2013.01); *H01L 29/7869* (2013.01); *H01L 29/78663* (2013.01)

(58) Field of Classification Search
CPC .......... H01L 29/78648; H01L 29/7869; H01L 29/78663

USPC ........................................................ 257/43
See application file for complete search history.

(56) References Cited

U.S. PATENT DOCUMENTS

| | | | |
|---|---|---|---|
| 2007/0207574 A1 | 9/2007 | Wang et al. | |
| 2011/0024755 A1* | 2/2011 | Korenari | H01L 27/1214 257/59 |
| 2011/0108846 A1 | 5/2011 | Choi et al. | |

FOREIGN PATENT DOCUMENTS

| | | |
|---|---|---|
| JP | 2005079549 | 3/2005 |
| KR | 100731430 | 6/2007 |
| KR | 101272892 | 6/2013 |

OTHER PUBLICATIONS

Abraham et al., "Double-gate thin-film transistor", Electronics Letters, vol. 1, No. 2, Apr. 1965, p. 49.
Jeong, et al., "Direct Current (DC) Bias Stress Characteristics of a Bottom-Gate Thin-Film Transistor with an Amorphous/ Microcrystalline Si Double Layer", Trans. Electr. Electron. Mater., vol. 12, No. 5, pp. 197-199, (2011).

* cited by examiner

*Primary Examiner* — Anthony Ho
(74) *Attorney, Agent, or Firm* — Cantor Colburn LLP (57) ABSTRACT

A thin film transistor includes: a lower gate electrode on a substrate; a gate insulating layer on the lower gate electrode; a first semiconductor layer on the gate insulating layer; a source electrode on the first semiconductor layer, a drain electrode on the first semiconductor layer and spaced apart form the source electrode; a second semiconductor layer on a channel region of the first semiconductor layer and on the source electrode and the drain electrode; a passivation layer on the second semiconductor layer; and an upper gate electrode disposed on the passivation layer, corresponding to the channel region.

12 Claims, 10 Drawing Sheets

FIG. 1A

PRIOR ART

THIN FILM TRANSISTOR AND DISPLAY DEVICE INCLUDING THE SAME

This application claims priority to Korean Patent Application No. 10-2015-0062422, filed on May 4, 2015, and all the benefits accruing therefrom under 35 U.S.C. §119, the content of which in its entirety is herein incorporated by reference.

BACKGROUND

1. Field

Embodiments of the invention relate to a thin film transistor, and more particularly, to a thin film transistor capable of low-voltage driving and a display device including the thin film transistor.

2. Description of the Related Art

Display devices are classified into types including liquid crystal display ("LCD") devices, organic light emitting diode ("OLED") display devices, plasma display panel ("PDP") devices, electrophoretic display ("EPD") devices, and the like, based on a light emitting scheme thereof.

A thin film transistor ("TFT") used in an LCD device or an OLED device is used as a switching element for controlling operation of each pixel and a driving element for driving a pixel. In this instance, the thin film transistor serves as an ON/OFF switch that allows or blocks a transmission of charge or power to a pixel electrode.

In general, such a thin film transistor includes a source region and a drain region doped with high-concentration impurities, an active layer having a channel region formed between the source region and the drain region, a gate electrode insulated from the active layer to be disposed in an area corresponding to the channel region, and a source electrode and a drain electrode contacting the source region and the drain region respectively.

The active layer includes a semiconductor material such as amorphous silicon ("a-Si") or polycrystalline silicon (polysilicon). In a case of the active layer being formed of amorphous silicon, carrier mobility therein is relatively low and thus a high-speed driving circuit may be difficult to be provided. In a case of the active layer being formed of polycrystalline silicon, carrier mobility therein is relatively high while a threshold voltage is non-uniform.

In recent times, research on the use of an oxide semiconductor as an active layer is being conducted in earnest. An oxide thin film transistor in which an oxide semiconductor is used as an active layer may be manufactured in a low-temperature process. In addition, due to having an amorphous shape, such an oxide thin film transistor may be convenient to be provided as a large-area oxide thin film transistor and may have an excellent electric characteristic, similarly to polycrystalline silicon.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the invention are directed to a thin film transistor capable of low-voltage driving.

Embodiments of the invention are directed to a display device capable of displaying a high-resolution image.

According to an exemplary embodiment of the invention, a thin film transistor includes: a lower gate electrode on a substrate; a gate insulating layer on the lower gate electrode; a first semiconductor layer on the gate insulating layer; a source electrode on the first semiconductor layer; a drain electrode on the first semiconductor layer and spaced apart from the source electrode; a second semiconductor layer on a channel region of the first semiconductor layer and on the source electrode and the drain electrode; a passivation layer on the second semiconductor layer; and an upper gate electrode disposed on the passivation layer, corresponding to the channel region.

In an exemplary embodiment, the first semiconductor layer and the second semiconductor layer may include a same material as each other or different materials from each other.

In an exemplary embodiment, the first semiconductor layer and the second semiconductor layer may include at least one selected from amorphous silicon, an oxide semiconductor, a nitride semiconductor, and an oxynitride semiconductor.

In an exemplary embodiment, the upper gate electrode may overlap at least a portion of the source electrode and at least a portion of the drain electrode.

In an exemplary embodiment, the upper gate electrode may include at least one of a metal, metal oxide, polysilicon, a conductive polymer, and a combination thereof.

In an exemplary embodiment, the upper gate electrode may be a transparent conductive electrode.

According to an exemplary embodiment of the invention, a method of manufacturing a thin film transistor, the method includes: providing a substrate; providing a lower gate electrode on the substrate; providing a gate insulating layer to cover the substrate and the lower electrode; providing a first semiconductor layer on the gate insulating layer; providing a source electrode and a drain electrode on the first semiconductor layer; providing a second semiconductor layer on the source electrode and the drain electrode to cover a channel region corresponding to the lower gate electrode and the source electrode and the drain electrode; forming a passivation layer on the second semiconductor layer; and forming an upper gate electrode on the passivation layer to correspond to the channel region.

In an exemplary embodiment, the first semiconductor layer and the second semiconductor layer may include a same material as each other or different materials from each other.

In an exemplary embodiment, the first semiconductor layer and the second semiconductor layer may include at least one material selected from: amorphous silicon, an oxide semiconductor, a nitride semiconductor, and an oxynitride semiconductor.

In an exemplary embodiment, the upper gate electrode may overlap at least a portion of the source electrode and at least a portion of the drain electrode.

In an exemplary embodiment, the upper gate electrode may include at least one of a metal, metal oxide, polysilicon, a conductive polymer, and a combination thereof.

In an exemplary embodiment, the upper gate electrode may be a transparent conductive electrode.

According to an exemplary embodiment of the invention, a display device includes: a first substrate; a gate line on the first substrate; a data line crossing the gate line; a thin film transistor connected to the gate line and the data line; and a pixel electrode connected to the thin film transistor, wherein the thin film transistor comprises, sequentially on the first substrate: a lower gate electrode; a gate insulating layer on the lower gate electrode; a first semiconductor layer on the gate insulating layer; a source electrode on the first semiconductor layer; a drain electrode on the first semiconductor layer and spaced apart from the source electrode; a second semiconductor layer on the source electrode and the drain electrode; a passivation layer on the second semiconductor layer; and an upper gate electrode on the passivation layer.

In an exemplary embodiment, the first semiconductor layer and the second semiconductor layer may include a same material as each other or different materials from each other.

In an exemplary embodiment, the first semiconductor layer and the second semiconductor layer may include at least one material selected from: amorphous silicon, an oxide semiconductor, a nitride semiconductor, and an oxynitride semiconductor.

In an exemplary embodiment, the upper gate electrode may overlap at least a portion of the source electrode and at least a portion of the drain electrode.

In an exemplary embodiment, the upper gate electrode may include at least one of a metal, metal oxide, polysilicon, a conductive polymer, and a combination thereof.

In an exemplary embodiment, the upper gate electrode may be a transparent conductive electrode.

In an exemplary embodiment, the foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features of embodiments of the invention will be more clearly understood from the following detailed description taken in conjunction with the accompanying drawings, in which.

DETAILED DESCRIPTION

Exemplary embodiments will now be described more fully hereinafter with reference to the accompanying drawings.

Although the invention can be modified in various manners and have several embodiments, specific embodiments are illustrated in the accompanying drawings and will be mainly described in the specification. However, the scope of the embodiments of the invention is not limited to the specific embodiments and should be construed as including all the changes, equivalents, and substitutions included in the spirit and scope of the invention.

In the drawings, the dimensions of certain elements or shapes may be simplified or exaggerated to better illustrate the invention, and other elements in an actual product may also be omitted. Thus, the drawings are intended to facilitate the understanding of the invention. Like reference numerals refer to like elements throughout the specification.

When a layer or element is referred to as being "on" another layer or element, the layer or element may be directly on the other layer or element, or one or more intervening layers or elements may be interposed therebetween.

Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When it is determined that a detailed description may make the purpose of the invention unnecessarily ambiguous in the description of the invention, such a detailed description will be omitted. In addition, the same components and corresponding components are given the same reference numeral.

Hereinafter, a conventional thin film transistor and a thin film transistor according to an exemplary embodiment will be described with reference to FIGS. 1A through 1C.

Figure 1A:
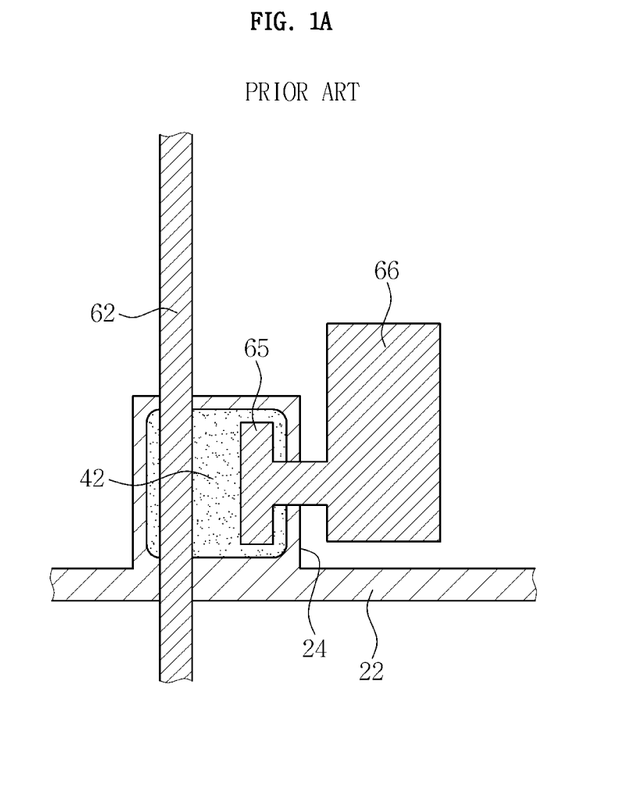
FIGS. 1A through 1C are schematic plan views illustrating a conventional thin film transistor and a thin film transistor according to an exemplary embodiment.
Figure 1B:
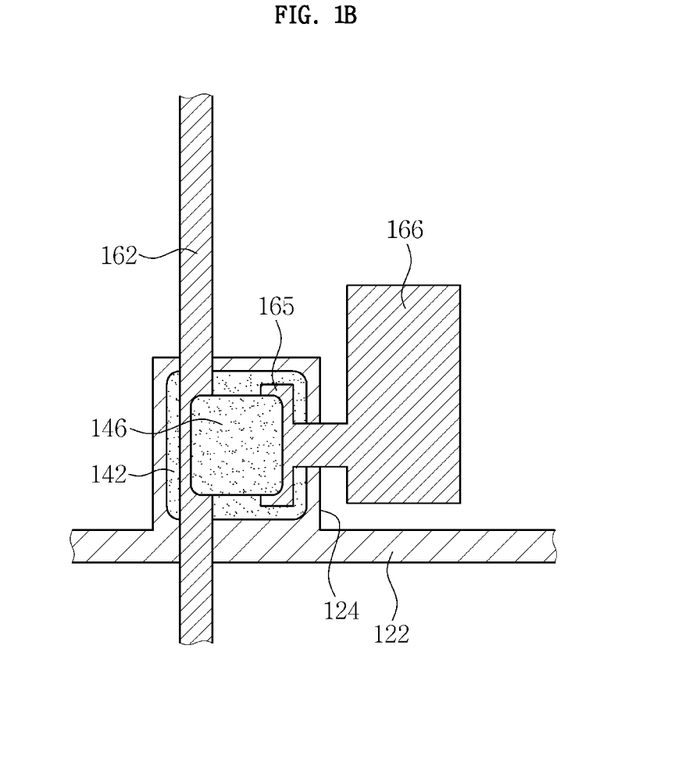
Figure 1C:
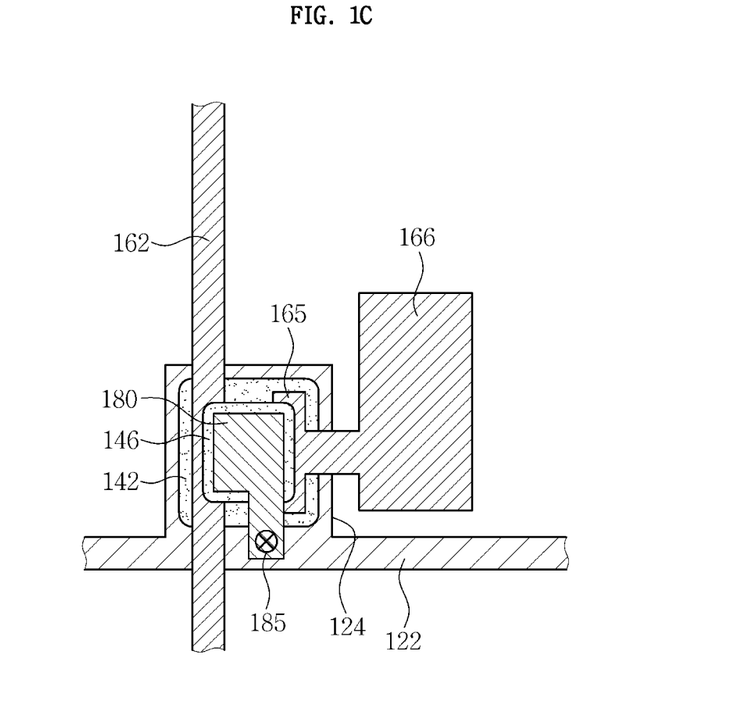

FIG. 1A is a plan view illustrating the conventional thin film transistor, and FIGS. 1B and 1C are schematic plan views illustrating the thin film transistor according to exemplary embodiments.

A structure of the thin film transistor will be described with reference to FIGS. 1A through AC, and respective components of the thin film transistor will be described later in detail with reference to FIG. 2.

As illustrated in FIG. 1A, the conventional thin film transistor generally has a structure including a gate electrode and a semiconductor layer. More particularly, the conventional thin film transistor typically includes a gate electrode 24; a gate insulating layer (not illustrated) on the gate electrode 24; a semiconductor layer 42 on the gate insulating layer; and a source electrode 65 and a drain electrode 66 on the semiconductor layer 42.

Although not illustrated, the conventional thin film transistor may have a structure including two gate electrodes and a semiconductor layer.

In an exemplary embodiment of the invention, as illustrated in FIGS. 1B and 1C, the thin film transistor may include two gate electrodes and two semiconductor layers. In such an embodiment, the thin film transistor may have a structure in which the semiconductor layers cover a source electrode and a drain electrode upwardly and downwardly, that is, the semiconductor layers are disposed above and below the source electrode and the drain electrode, respectively.

FIG. 1B illustrates an exemplary embodiment of the thin film transistor having a structure in which a second semiconductor layer 146 is disposed on a source electrode 165 and a drain electrode 166, and FIG. 1C illustrates an alternative exemplary embodiment of the thin film transistor having a structure in which a passivation layer (not illustrated) and an upper gate electrode 180 are sequentially disposed on the second semiconductor layer 146.

The upper gate electrode 180 may be connected to a lower gate electrode 124 through a contact hole 185 (refer to FIG. 1C) defined through a gate insulating layer and the passivation layer.

In such an embodiment of the thin film transistor, first and second semiconductor layers 142 and 146 may be disposed between the lower gate electrode 124 and the source and drain electrodes 165 and 166, and between the upper gate electrode 180 and the source and drain electrodes 165 and 166. In such an embodiment of the thin film transistor, carrier injection through the lower gate electrode 124 and the upper gate electrode 180 may be effectively performed and low-voltage driving may be achieved.

Figure 2:
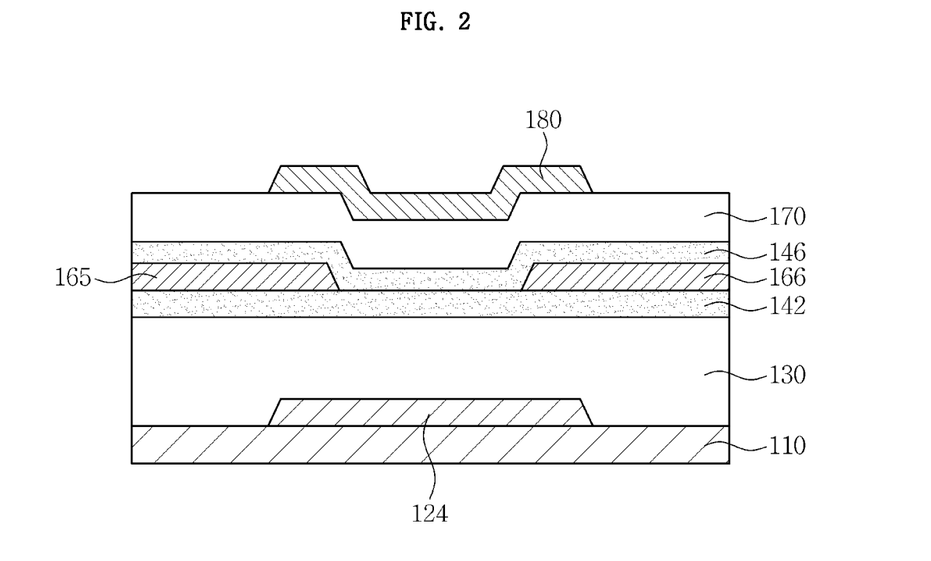
FIG. 2 is a schematic cross-sectional view illustrating a thin film transistor according to an exemplary embodiment.

FIG. 2 is a schematic cross-sectional view illustrating the thin film transistor according to an exemplary embodiment.

Referring to FIGS. 1C and 2, an exemplary embodiment of the thin film transistor may include the lower gate electrode 124, a gate insulating layer 130, the first semiconductor layer 142, the source electrode 165, the drain electrode 166, the second semiconductor layer 146, a passivation layer 170 and the upper gate electrode 180.

In such an embodiment, gate wirings 122 and 124 for transmitting a gate signal may be disposed on a substrate 110. The gate wirings 122 and 124 may include a gate line 122 extending in a direction, for example, a transverse direction, and a gate electrode 124 defined by a protruding portion of the gate line 122, thereby having a protrusion shape. The gate electrode 124, along with the source electrode 165, the drain electrode 166 and the first and second semiconductor layers 142 and 146, which will be described later in greater detail, may constitute or collectively define the thin film transistor.

Although not illustrated, a storage wiring that defines a storage capacitor, and a first electrode 190 may further be disposed on the substrate 110. The storage wiring may include or be formed of the same material as a material of the gate wirings 122 and 124, and may be disposed on the same layer on which the gate wirings 122 and 124 are disposed or disposed in the same layer as the gate wirings 122 and 124.

The gate wirings 122 and 124 may include or be formed of at least one material selected from: an aluminum (Al) based metal such as Al or an Al alloy, a silver (Ag) based metal such as Ag or an Ag alloy, a copper (Cu) based metal such as Cu or an Cu alloy, a molybdenum (Mo) based metal such as Mo or a Mo alloy, chromium (Cr), tantalum (Ta), titanium (Ti), and the like.

The gate wirings 122 and 124 may have a multilayer structure including at least two conductive layers having different physical properties from each other. In an exemplary embodiment, one of the two conductive layers may include a metal, for example, an Al-based metal, an Ag-based metal or a Cu-based metal, which has relatively low resistivity to reduce a signal delay or a voltage drop of the gate wirings 122 and 124. In such an embodiment, the other of the two conductive layers may include a material, for example, a Mo-based metal, Cr, Ti or Ta, which has an excellent contact characteristic with respect to transparent conductive oxide ("TCO") such as indium-tin oxide ("ITO"), indium-zinc oxide ("IZO") or aluminum-zinc oxide ("AZO").

In one exemplary embodiment, for example, such a multilayer structure of the gate wirings 122 and 124 may include a wiring having a Cr lower layer and an Al upper layer, a wiring having an Al lower layer and a Mo upper layer, or a wiring having a Ti lower layer and a Cu upper layer. However, exemplary embodiments of the invention are not limited thereto, and the gate wirings 122 and 124 may include various metals and conductive materials.

The gate insulating layer 130 may be disposed on the substrate 110 and the gate wirings 122 and 124. The gate insulating layer 130 may include at least one of oxide, nitride, an insulating polymer, and a combination thereof.

The gate insulating layer 130 may include silicon oxide ($SiO_x$) or silicon nitride ($SiN_x$). In an exemplary embodiment, the gate insulating layer 130 may further include aluminum oxide, titanium oxide, tantalum oxide, or zirconium oxide.

The first semiconductor layer 142, in which a channel of the thin film transistor is formed, may be disposed on the gate insulating layer 130. At least a portion of the first semiconductor layer 142 may overlap the lower gate electrode 124. The first semiconductor layer 142 may include an oxide semiconductor including at least one material selected from: gallium (Ga), indium (In), tin (Sn), and zinc (Zn).

However, exemplary embodiments of the invention are not limited thereto, and the first semiconductor layer 142 may include at least one of amorphous silicon ("a-Si"), a nitride semiconductor, and an oxynitride semiconductor.

Although not illustrated, an ohmic contact layer may be disposed on the first semiconductor layer 142. The ohmic contact layer may serve to enhance a contact characteristic between the source or drain electrode 165 or 166 and the first semiconductor layer 142.

Data wirings 162, 165 and 166 may be disposed on the first semiconductor layer 142 and the gate insulating layer 130. The data wirings 162, 165 and 166 may include a data line 162 disposed in a direction crossing or intersecting the gate line 122, for example, a longitudinal direction, the source electrode 165 branched off from the data line 162 to extend on to the first semiconductor layer 142, and the drain electrode 166 disposed on the first semiconductor layer 142 while opposing the source electrode 165. The drain electrode 166 may extend from an upper portion of the first semiconductor layer 142 to a lower portion of the first electrode 190 (refer to FIG. 4).

The source electrode 165 and the drain electrode 166 may include at least one material selected from: a metal, metal oxide, polysilicon, a conductive polymer, and a combination thereof.

The second semiconductor layer 146 may be disposed over the data wirings 162, 165 and 166 and an exposed portion of the first semiconductor layer 142. In an exemplary embodiment, as shown in FIG. 2, the second semiconductor layer 146 may be disposed on the first semiconductor layer 142, the source electrode 165 and the drain electrode 166.

The second semiconductor layer 146 may include a material the same as or different from that of the first semiconductor layer 142. At least a portion of the second semiconductor layer 146 may overlap the lower gate electrode 124. In one exemplary embodiment, the second semiconductor layer 146 may include an oxide semiconductor. In one exemplary embodiment, for example, the second semiconductor layer 146 may include or be formed of an oxide semiconductor including at least one material selected from: gallium (Ga), indium (In), tin (Sn), and zinc (Zn).

However, exemplary embodiments of the invention are not limited thereto, and the second semiconductor layer 146 may also include at least one material selected from: a-Si, an oxide semiconductor, a nitride semiconductor, and an oxynitride semiconductor.

The passivation layer 170 may be disposed on the second semiconductor layer 146. The passivation layer 170 may include at least one material selected from: oxide, nitride, an insulating polymer, and a combination thereof.

The passivation layer 170 may have a monolayer or multilayer structure including silicon oxide ($SiO_x$), silicon nitride ($SiN_x$), an organic material having photosensitivity, a low-dielectric-constant insulating material such as a-Si:C:O or a-Si:O:F, or the like.

The upper gate electrode 180 corresponding to the lower gate electrode 124 may be disposed on the passivation layer 170. The upper gate electrode 180 may overlap at least a portion of the source electrode 165 and at least a portion of the drain electrode 166.

The upper gate electrode 180 may include at least one material selected from: a metal, metal oxide, polysilicon, a conductive polymer, and a combination thereof. In an exemplary embodiment, the upper gate electrode 180 may be a transparent conductive electrode such as ITO or IZO. However, exemplary embodiments of the invention are not limited thereto.

The upper gate electrode 180 may be connected to the lower gate electrode 124 through the contact hole 185 defined through the passivation layer 170 and the gate insulating layer 130. Alternatively, an additional voltage may be applied to the upper gate electrode 180 through an additional electrode.

In an exemplary embodiment of the invention, as described above, the thin film transistor may have a structure including two gate electrodes, that is, the lower gate electrode 124 and the upper gate electrode 180, and a double-semiconductor layer, that is, the first semiconductor layer 142 and the second semiconductor layer 146, covering the source electrode 165 and the drain electrode 166 upwardly and downwardly of the source electrode 165 and the drain electrode 166.

In an exemplary embodiment, as described above, the thin film transistor may have a back-channel etch ("BCE") structure, but not being limited thereto. In one alternative exemplary embodiment, for example, the thin film transistor may have an etch stopper ("ES") structure.

In an exemplary embodiment, the second semiconductor layer 146 may be disposed between the upper gate electrode 180, and the source electrode 165 and the drain electrode 166; thus, carrier injection through the upper gate electrode 180 may be readily or effectively performed. Accordingly, as compared to the conventional thin film transistor (refer to FIG. 1A), an exemplary embodiment of the thin film transistor according to the invention may be effectively used for a switching and/or driving with low-voltage and for displaying a high-resolution image.

FIGS. 3A through 3G are schematic cross-sectional views illustrating a method of manufacturing the thin film transistor according to an exemplary embodiment.

Figure 3A:
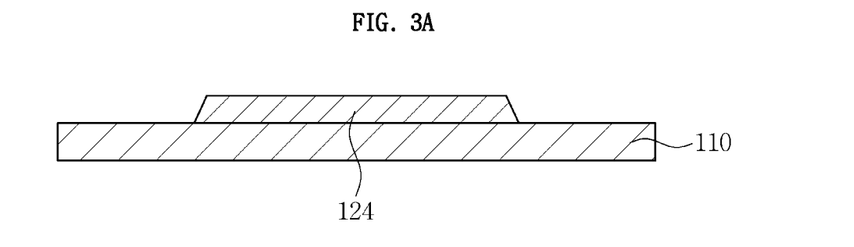
FIGS. 3A through 3G are views illustrating a method of manufacturing a thin film transistor according to an exemplary embodiment.

Referring to FIG. 3A, the lower gate electrode 124 may be provided or formed on the substrate 110. In such an embodiment, a gate line (not illustrated) may be provided along with the lower gate electrode 124, thereby providing the gate wirings 122 and 124.

In an exemplary embodiment, prior to forming the lower gate electrode 124 of the thin film transistor, a buffer layer (not illustrated) may further be formed on the substrate 110. The buffer layer may serve to block the infiltration of impure elements from the substrate 110 to layers disposed on the substrate 110. The buffer layer may include silicon oxide ($SiO_2$) and/or silicon nitride ($SiN_x$).

In an exemplary embodiment, the substrate 110 may include or be formed of transparent glass containing silicon oxide ($SiO_2$) as a main component. In an exemplary embodiment, the substrate 110 may include a plastic material. The substrate 110 may include a metal foil and a flexible substrate.

The lower gate electrode 124 may include or be formed of a metal or a metal alloy such as gold (Au), silver (Ag), copper (Cu), nickel (Ni), platinum (Pt), palladium (Pd), aluminum (Al), molybdenum (Mo), tungsten (W), titanium (Ti), or Al:Nd or Mo:W alloys. However, the material of the lower gate electrode 124 is not limited thereto, and various materials may be used based on adhesiveness to an adjacent layer, flatness of a stacked layer, electric resistance, processability, and the like.

Figure 3B:
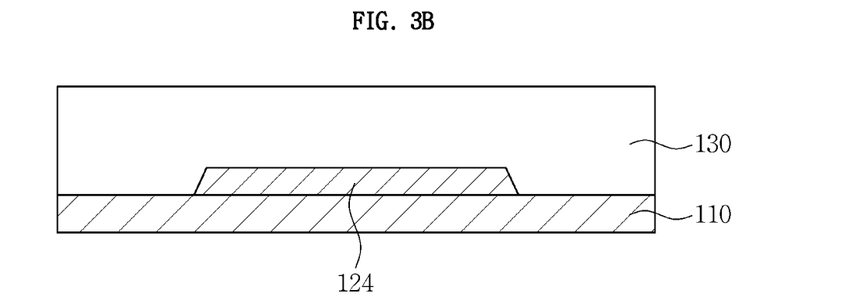
Figure 3C:
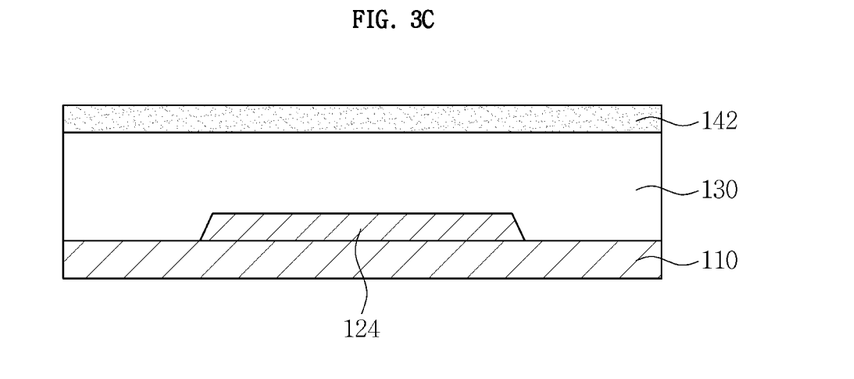

Referring to FIGS. 3B and 3C, the gate insulating layer 130 and the first semiconductor layer 142 may be sequentially provided or formed on the lower gate electrode 124.

In an exemplary embodiment, the gate insulating layer 130 may be formed on the substrate 110 on which the lower gate electrode 124 is formed. The gate insulating layer 130 may include or be formed of an insulating material such as silicon oxide ($SiO_x$) or silicon nitride ($SiN_x$). Alternatively, the gate insulating layer 130 may include or be formed of an insulating organic material, or the like. In an exemplary embodiment, the gate insulating layer 130 may have a multilayer structure including at least two insulating layers having different physical or chemical properties from each other.

Subsequently, the first semiconductor layer 142 may be formed on the gate insulating layer 130. The first semiconductor layer 142 may include a channel region in which the first semiconductor layer 142 overlaps the lower gate electrode 124 and may include an oxide semiconductor.

The first semiconductor layer 142 may include an oxide semiconductor including at least one selected from: indium (In), gallium (Ga), zinc (Zn), tin (Sn), antimony (Sb), germanium (Ge), hafnium (Hf) and arsenic (As). In one exemplary embodiment, for example, the oxide semiconductor may include at least one of ZnO, $SnO_2$, $In_2O_3$, $Zn_2SnO_4$, $Ga_2O_3$ and $HfO_2$. In an exemplary embodiment, the first semiconductor layer 142 may include or be formed of a transparent oxide semiconductor.

The first semiconductor layer 142 may be formed through a sputtering scheme, which is a physical deposition scheme. The first semiconductor layer 142 may be formed by adjusting an oxygen flow rate based on a resistance level of an element.

Figure 3D:
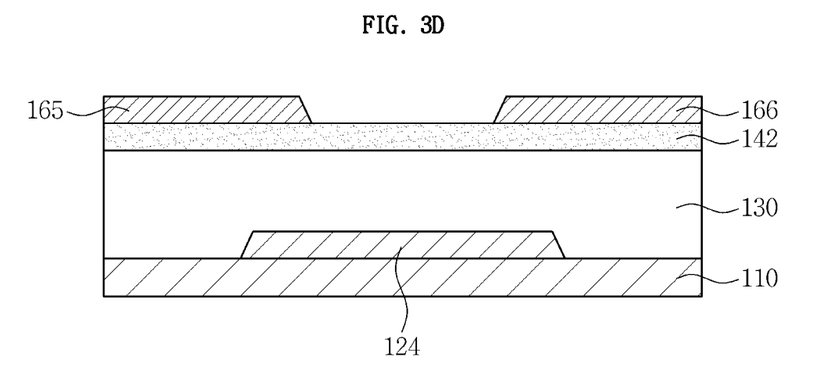

Referring to FIG. 3D, the source electrode 165 and the drain electrode 166 may be provided or formed on the first semiconductor layer 142.

The source electrode 165 and the drain electrode 166 may be formed to have a monolayer or multilayer structure on the substrate 110 on which the first semiconductor layer 142 is formed. The source electrode 165 and the drain electrode 166 may contact opposing ends of the first semiconductor layer 142, respectively. The source electrode 165 and the drain electrode 166 may include or be formed of a conductive material, and for example, a metal such as chromium (Cr), platinum (Pt), ruthenium (Ru), gold (Au), silver (Ag), molybdenum (Mo), aluminum (Al), tungsten (W), copper (Cu) or aluminum-neodymium (AlNd), a metal such as ITO, gallium-indium-zinc-oxide ("GIZO"), gallium-zinc-oxide ("GZO"), AZO (AlZnO), or IZO (InZnO), or conductive oxide.

Figure 3E:
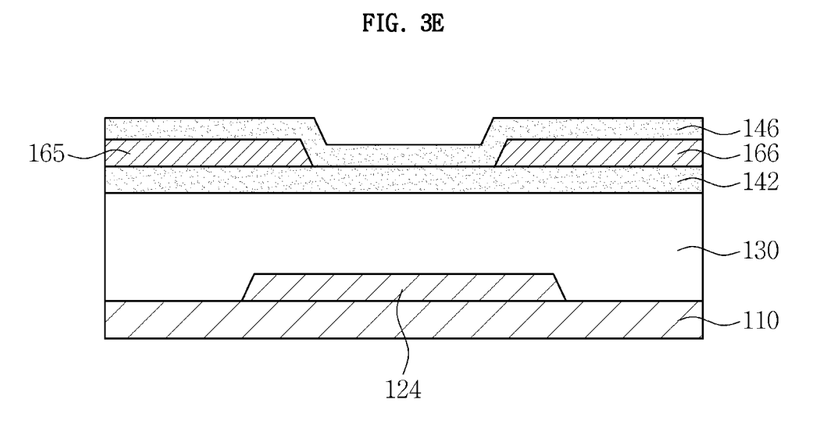

Referring to FIG. 3E, the second semiconductor layer 146 may be formed on the source electrode 165 and the drain electrode 166 to cover the source electrode 165 and the drain electrode 166. In one exemplary embodiment, for example, the second semiconductor layer 146 may be coated on the source electrode 165 and the drain electrode 166.

The second semiconductor layer 146 may include or be formed of a material the same as or different from that of the first semiconductor layer 142.

The second semiconductor layer 146 may include a channel region in which the second semiconductor layer 146 overlaps the lower gate electrode 124, and may include an oxide semiconductor. The second semiconductor layer 146 may include an oxide semiconductor including at least one material selected from: indium (In), gallium (Ga), zinc (Zn), tin (Sn), antimony (Sb), germanium (Ge), hafnium (Hf) and arsenic (As). I none exemplary embodiment, for example, the oxide semiconductor may include at least one of ZnO, $SnO_2$, $In_2O_3$, $Zn_2SnO_4$, $Ga_2O_3$ and $HfO_2$. In addition, the second semiconductor layer 146 may include or be formed of a transparent oxide semiconductor.

The second semiconductor layer 146 may be formed through a sputtering scheme, which is a physical deposition scheme. The second semiconductor layer 146 may be formed by adjusting an oxygen flow rate based on a resistance level of an element.

Figure 3F:
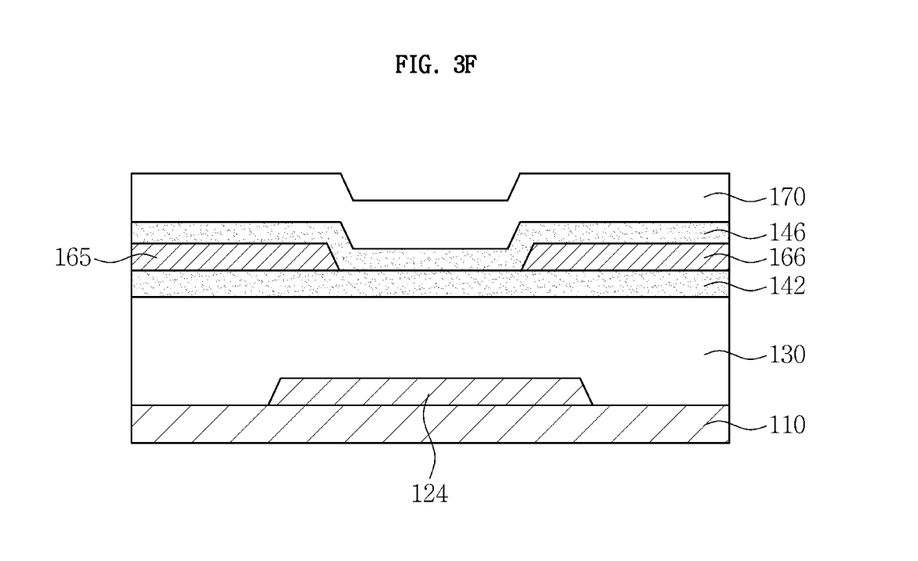

Referring to FIG. 3F, the passivation layer 170 may be provided or coated on the substrate 110 on which the second semiconductor layer 146 is formed.

The passivation layer 170 may be provided in various shapes, and may include or be formed of an organic material such as benzocyclobutene (BCB) or acryl or an inorganic material such as silicon nitride ($SiN_x$). In such an embodiment, the passivation layer 170 may be modified into various structures including such as a monolayer structure, a double-layer structure or a multilayer structure.

Figure 3G:
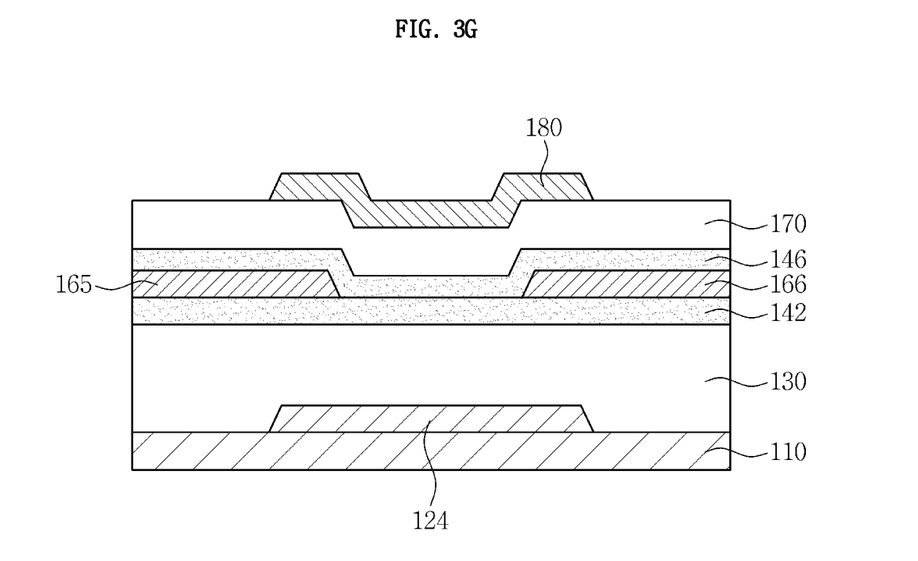

Referring to FIG. 3G, the upper gate electrode 180 may be provided or formed on the passivation layer 170.

The upper gate electrode 180 may include at least one material selected from: a metal, metal oxide, polysilicon, a conductive polymer, and a combination thereof.

In an exemplary embodiment, the upper gate electrode 180 may be a transparent conductive electrode including such as IZO ITO. However, the type of the upper gate electrode 180 is not limited thereto.

The upper gate electrode 180, as described above, may be positioned to be connected to the lower gate electrode 124 through the contact hole 185 (refer to FIG. 1C) formed or defined through the gate insulating layer 130 and the passivation layer 170.

However, exemplary embodiments of the invention are not limited thereto, and alternatively, a pixel electrode of a display device may be used as the upper gate electrode 180. In such an embodiment, the upper gate electrode 180 may be omitted, and an external power unit and a wiring for applying a voltage to the upper gate electrode 180 may be omitted.

Hereinafter, a display device including the thin film transistor according to an exemplary embodiment will be described.

Figure 4:
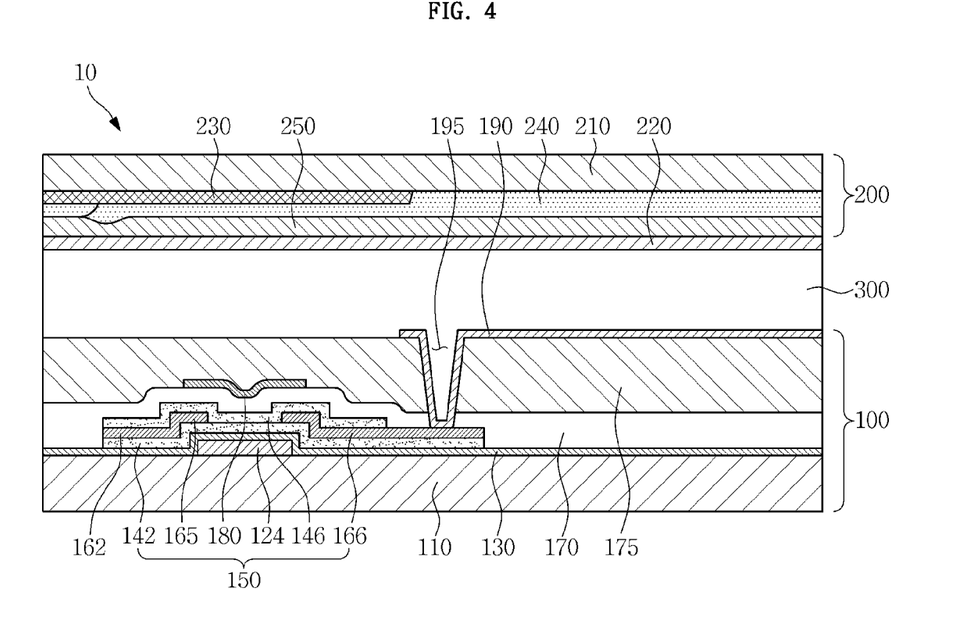
FIG. 4 is a cross-sectional view illustrating a display device according to an exemplary embodiment.

FIG. 4 is a cross-sectional view illustrating a liquid crystal display ("LCD") device 10 including a thin film transistor 150 according to an exemplary embodiment.

FIG. 4 shows an exemplary embodiment of the display device where the display device is an LCD device, but exemplary embodiments of the invention are not limited thereto. In an alternative exemplary embodiment, the display device may be an organic light emitting diode ("OLED") display device.

In an exemplary embodiment, the LCD device 10 may include a first substrate 110, a second substrate 210 opposing the first substrate 110, and a liquid crystal layer 300 between the first substrate 110 and the second substrate 210.

Referring to FIG. 4, the LCD device 10 may include a lower panel 100, an upper panel 200, and the liquid crystal layer 300 between the lower panel 10 and the upper panel 200.

The lower panel 100 may include the first substrate 110, the thin film transistor 150 on the first substrate 110, a planarization layer 175 on the thin film transistor 150, and a first electrode 190 on the planarization layer 175.

The first substrate 110 may use an insulating substrate including or formed of a transparent material such as glass or plastic.

The thin film transistor 150 may be disposed on the first substrate 110. In such an embodiment, the thin film transistor 150 is substantially the same as an exemplary embodiment of the thin film transistor described herein, e.g., the thin film transistor described with reference to FIG. 2, and any repetitive description thereof will be omitted for conciseness.

A structure including the substrate 110 and the thin film transistor 150 may be referred to as a semiconductor device. Such a semiconductor device may be used in electric and/or electronic devices, in addition to a display device.

The structure of an exemplary embodiment of the thin film transistor is not limited to the structure of the thin film transistor 150 described above with reference to FIG. 2, and may be variously modified.

The planarization layer 175 may be disposed on an upper gate electrode 180 and a passivation layer 170 of the thin film transistor 150. The planarization layer 175 may have a monolayer or multilayer structure including silicon oxide ($SiO_x$), silicon nitride ($SiN_x$), an organic material having photosensitivity, a low-dielectric-constant insulating material such as a-Si:C:O or a-Si:O:F, or the like. The planarization layer 175 may serve to planarize an upper portion of the thin film transistor 150.

A portion of the passivation layer 170 and a portion of the planarization layer 175 may be removed to form a contact hole 195 through which a portion of the drain electrode 166, which is disposed below the first electrode 190, is exposed.

The first electrode 190 electrically connected to the drain electrode 166 through the contact hole 195 may be disposed on the planarization layer 175. The first electrode 190 may include TCO such as ITO, IZO or AZO. According to an exemplary embodiment, the first electrode 190 may be a pixel electrode and may be disposed in a pixel region.

Although not illustrated, a lower alignment layer may be disposed on the first electrode 190 and the planarization layer 175. The lower alignment layer may be a homeotropic alignment layer, and may include a photosensitive material. In one exemplary embodiment, for example, the lower alignment layer may include at least one material selected from: polyamic acid, polysiloxane, and polyimide.

The upper panel 200 may include a second substrate 210, a light shielding layer 230, a color filter 240, an overcoat layer 250, and a second electrode 220.

The second substrate 210 may include or be formed of a transparent material such as glass or plastic.

The light shielding layer 230 may be disposed on the second substrate 210. The light shielding layer 230, also referred to as a black matrix, may divide a plurality of color filters 240 and may define a pixel region.

In an exemplary embodiment, the light shielding layer 230 may serve to prevent light emitted from a backlight unit (not illustrated) from being transmitted externally, and may effectively prevent external light from being irradiated to a gate line 122, a data line 162, or the thin film transistor 150. The light shielding layer 230 may overlap the gate line 122, the data line 162, and the thin film transistor 150. In one exemplary embodiment, for example, the light shielding layer 230 may have a lattice structure in which the light shielding layers 230 are disposed along the gate line 122 and the data line 162.

The color filter 240 may be disposed in the pixel region divided by the light shielding layer 230. The color filter 240 may include a red color filter, a green color filter and a blue color filter, for example, but not being limited thereto.

The red color filter, the green color filter and the blue color filter may be disposed corresponding to a red pixel region, a green pixel region and a blue pixel region, respectively.

The overcoat layer 250 may be disposed on the color filter 240. The overcoat layer 250 may planarize an upper portion of the color filter 240, and may protect the color filter 240. The overcoat layer 250 may include or be formed of an acrylic epoxy material, for example.

The second electrode 220 may be disposed on the overcoat layer 250. The second electrode 220 may be a common electrode.

The second electrode 220 may include or be formed of TCO such as ITO, IZO or AZO.

Although not illustrated, the upper panel 200 may further include an upper alignment layer. The upper alignment layer may be disposed on the second electrode 220. The upper alignment layer may include or be formed of the same material forming the aforementioned lower alignment layer.

A column spacer (not illustrated) may be disposed between the lower panel 100 and the upper panel 200. The column spacer may maintain an interval between the lower panel 100 and the upper panel 200, thereby maintaining a cell gap of the LCD device 10.

When surfaces of the first substrate 110 and the second substrate 210 that oppose one another, e.g., inner surfaces, are defined as upper surfaces of the corresponding substrates, respectively, and surfaces of the first substrate 110 and the second substrate 210 opposite to the upper surfaces thereof, e.g., outer surfaces, are defined as lower surfaces of the corresponding substrates, respectively, an upper polarizer may further be disposed on the lower surface of the first substrate 110, and a lower polarizer (not illustrated) may further be disposed on the lower surface of the second substrate 210.

The liquid crystal layer 300 may be disposed in a space defined between the lower panel 100 and the upper panel 200. The liquid crystal layer 300 may include liquid crystal molecules. Within the liquid crystal layer 300, the liquid crystal molecules may have a structure in which a major or longitudinal axis of the liquid crystal molecules is parallel to one of the upper panel 200 and the lower panel 100 and a direction of the major axis is twisted into a spiral shape at an angle of 90 degrees from a rubbing direction of the alignment layer of the lower panel 100 to the upper panel 200. Alternatively, the liquid crystal layer 300 may include homeotropic liquid crystal molecules.

In such an embodiment, the LCD device 10 may display a high-resolution image.

Figure 5:
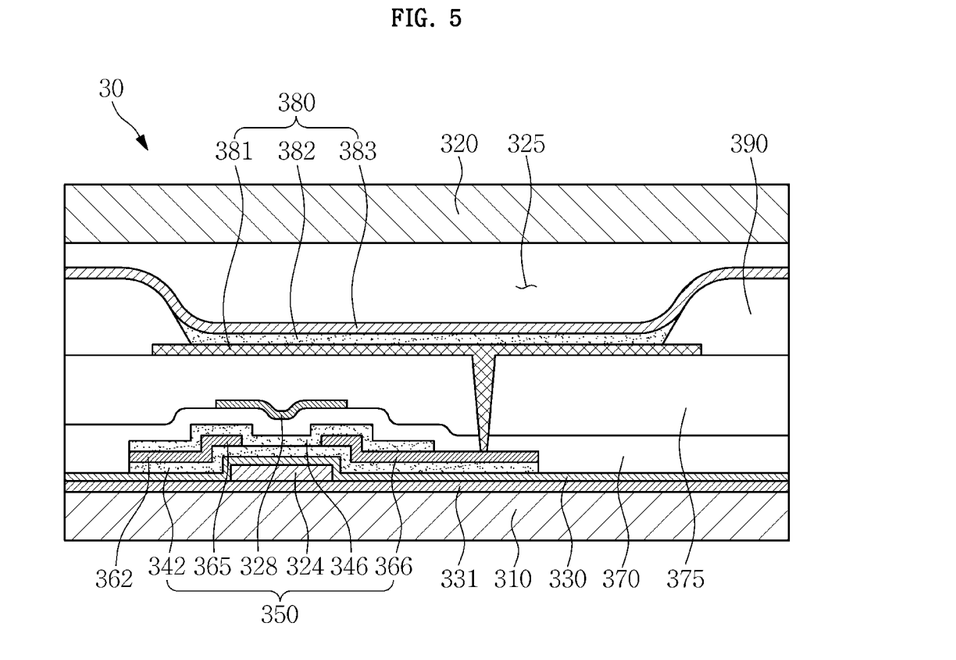
FIG. 5 is a cross-sectional view illustrating a display device according to an alternative exemplary embodiment.

FIG. 5 is a cross-sectional view illustrating a display device according to an alternative exemplary embodiment. FIG. 5 shows an exemplary embodiment where the display device is an OLED display device 30.

In such an embodiment, the OLED display device 30 may include a first substrate 310, a buffer layer 331, a thin film transistor 350, a planarization layer 375, and an OLED 380.

The first substrate 310 may include or be formed of an insulating material including such as glass, quartz, ceramic, or plastic, for example. In an alternative exemplary embodiment, the first substrate 310 may include or be formed of a metal material such as stainless steel.

The buffer layer 331 may be disposed on the first substrate 310. The buffer layer 331 may include one or more layers selected from various inorganic layers and organic layers. The buffer layer 331 may serve to block the infiltration of impure elements, such as moisture, to the thin film transistor 350 or to the OLED 380, and to planarize a surface of the first substrate 310. In an alternative exemplary embodiment, the buffer layer 331 may be omitted.

The thin film transistor 350 may be disposed on the buffer layer 331.

In an exemplary embodiment, a lower gate electrode 324 may be disposed on the buffer layer 331, and a gate insulating layer 330 may be disposed on the lower gate electrode 324. A first semiconductor layer 342 may be disposed on the gate insulating layer 330. A source electrode 365 and a drain electrode 366 may be disposed on the first semiconductor layer 342 while being spaced apart from one another. A second semiconductor layer 346 may be disposed on the source electrode 365 and the drain electrode 366, and a passivation layer 370 and an upper gate electrode 328 may be sequentially disposed on the second semiconductor layer 346.

In such an embodiment, the thin film transistor 350 is substantially the same as an exemplary embodiment of the thin film transistor described herein, and any repetitive detailed description of elements thereof, e.g., the lower and upper gate electrodes 324 and 328, the first and second semiconductor layers 342 and 346, the source electrode 365, and the drain electrode 366, will be omitted for conciseness.

The planarization layer 375 may be disposed on the passivation layer 370 and the upper gate electrode 328.

In such an embodiment, the planarization layer 375 may be the same as the planarization layer 175 described above with reference to FIG. 4, and any repetitive detailed description thereof will be omitted for conciseness.

The OLED 380 may include a first electrode 381, an organic light emitting layer 382 on the first electrode 381, and a second electrode 383 on the organic light emitting layer 382.

The first electrode 381 of the OLED 380 may be connected to the drain electrode 366 of the thin film transistor 350 through a contact hole defined in the planarization layer 375 and the passivation layer 370.

A hole and an electron respectively from the first electrode 381 and the second electrode 383 are injected into the organic light emitting layer 382. The injected hole and the electron are combined with one another to form an exciton. The OLED 380 may emit light by energy generated when the exciton falls from an excited state to a ground state.

In an exemplary embodiment, the first electrode 381 is a reflective electrode, and the second electrode 383 is a transflective electrode. Accordingly, light generated from the organic light emitting layer 382 may be transmitted through the second electrode 383 to be emitted.

Although not illustrated, at least one of a hole injection layer ("HIL") and a hole transporting layer ("HTL") may further be interposed between the first electrode 381 and the organic light emitting layer 382; and at least one of an electron transporting layer ("ETL") and an electron injection layer ("EIL") may further be interposed between the organic light emitting layer 382 and the second electrode 383.

A pixel defining layer 390 may be disposed on an edge of the first electrode 381. The pixel defining layer 390 may have an aperture. The aperture of the pixel defining layer 390 may expose a portion of the first electrode 381. The second electrode 383 may be disposed on the organic light emitting layer 382 and the pixel defining layer 390. The OLED 380 may emit light which is generated from the organic light emitting layer 382 positioned in the aperture of the pixel defining layer 390. As such, the pixel defining layer 390 may define a light emission region.

Although not illustrated, a capping layer may be disposed on the second electrode 383. The capping layer may protect the OLED 380.

In an exemplary embodiment, a second substrate 320 may be disposed on the OLED 380 to oppose the first substrate 310, to protect the OLED 380. The second substrate 320 may include or be formed of the same material as the first substrate 310.

An inertial gas, such as nitrogen gas $N_2$, may be filled in a space 325 between the second electrode 383 and the second substrate 320.

In an exemplary embodiment, the OLED display device 30 may provide a high-resolution image.

Hereinafter, an electric characteristic of the thin film transistor according to an exemplary embodiment will be described with reference to FIG. 6.

Figure 6:
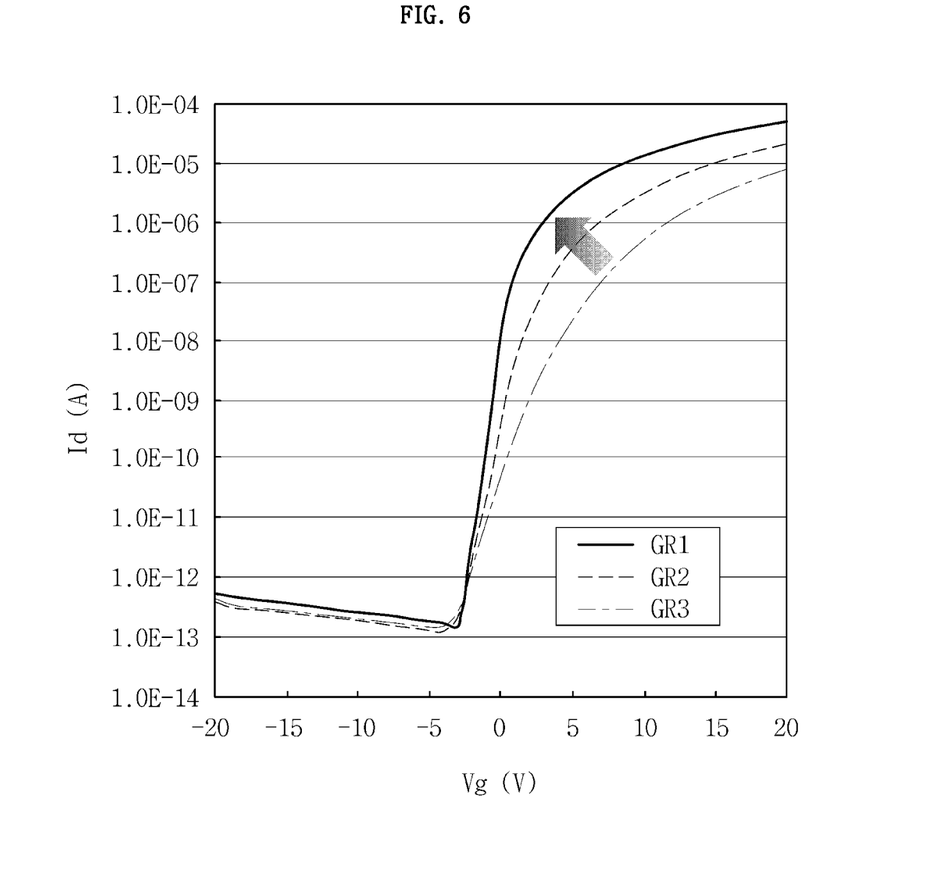
FIG. 6 illustrates graphs of a source-drain current based on a gate voltage of a thin film transistor according to an exemplary embodiment.

FIG. 6 illustrates graphs of a source-drain current Id based on a gate voltage Vg of the thin film transistor according to an exemplary embodiment. The graphs may provide comparisons between the thin film transistor according to the exemplary embodiment and two types of conventional thin film transistors. In the graphs, a transverse axis indicates a gate voltage Vg, and a longitudinal axis indicates a drain current Id.

In FIG. 6, a first graph GR1 may represent a source-drain current based on a gate voltage of the thin film transistor according to an exemplary embodiment; a second graph GR2 may represent a source-drain current based on a gate voltage of a first conventional thin film transistor including a gate electrode and a semiconductor layer; and a third graph GR3 may represent a source-drain current based on a gate voltage of a second conventional thin film transistor including two gate electrodes and a semiconductor layer.

Referring to FIG. 6, the first graph GR1 may be shifted to the left as compared to the second and third graphs GR2 and GR3. As shown in FIG. 6, from among the first through third graphs GR1 through GR3, the first graph GR1 may have a highest on-current of a drain electrode at about 20 volts (V) which is a level of a gate-on voltage. Accordingly, as shown in FIG. 6, the thin film transistor according to an exemplary embodiment to which a predetermined level of gate voltage is applied may have a relatively high level of a source-drain current of the thin film transistor.

FIG. 6 shows that the thin film transistor according to an embodiment is capable of low-voltage driving.

In exemplary embodiment, the thin film transistor may have a structure in which the semiconductor layers cover the source electrode and the drain electrode upwardly and downwardly of the source electrode and the drain electrode, by disposing the second semiconductor layer on the source electrode and the drain electrode. In such embodiments, the second semiconductor layer may be disposed between the upper gate electrode, and the source electrode and the drain electrode; thus, carrier injection through the upper gate electrode may be readily performed. Accordingly, in such embodiments, an on-current based on a gate voltage may be magnified to enable low-voltage driving.

Such embodiments of the thin film transistor may be suitable for a switching and/or driving thin film transistor of a display device having a high-resolution.

As set forth above, according to one or more exemplary embodiments, the display device including the thin film transistor may be capable of low-voltage driving and displaying a high-resolution image as an on-current is magnified.

From the foregoing, it will be appreciated that various embodiments in accordance with the disclosure have been described herein for purposes of illustration, and that various modifications may be made without departing from the scope and spirit of the teachings herein. Accordingly, the various embodiments disclosed herein are not intended to be limiting of the true scope and spirit of the teachings herein. Various features of the above described and other embodiments can be mixed and matched in any manner, to produce further embodiments consistent with the invention.

What is claimed is:

1. A thin film transistor comprising:
   a lower gate electrode on a substrate;
   a gate insulating layer on the lower gate electrode;
   a first semiconductor layer on the gate insulating layer;
   a source electrode on the first semiconductor layer;
   a drain electrode on the first semiconductor layer and spaced apart from the source electrode;
   a second semiconductor layer on a channel region of the first semiconductor layer and on the source electrode and the drain electrode;
   a passivation layer on the second semiconductor layer; and
   an upper gate electrode disposed on the passivation layer, corresponding to the channel region.

2. The thin film transistor of claim 1, wherein the first semiconductor layer and the second semiconductor layer comprises the same material as each other or different materials from each other.

3. The thin film transistor of claim 2, wherein the first semiconductor layer and the second semiconductor layer comprises at least one material selected from: amorphous silicon, an oxide semiconductor, a nitride semiconductor, and an oxynitride semiconductor.

4. The thin film transistor of claim 1, wherein the upper gate electrode overlaps at least a portion of the source electrode and at least a portion of the drain electrode.

5. The thin film transistor of claim 1, wherein the upper gate electrode includes at least one of a metal, metal oxide, polysilicon, a conductive polymer, and a combination thereof.

6. The thin film transistor of claim 5, wherein the upper gate electrode is a transparent conductive electrode.

7. A display device comprising:
   a first substrate;
   a gate line on the first substrate;
   a data line crossing the gate line;
   a thin film transistor connected to the gate line and the data line; and
   a pixel electrode connected to the thin film transistor,
   wherein the thin film transistor comprises:
      a lower gate electrode on the first substrate;
      a gate insulating layer on the lower gate electrode;
      a first semiconductor layer on the gate insulating layer;
      a source electrode and a drain electrode on the first semiconductor layer;
      a second semiconductor layer on the source electrode and the drain electrode;
      a passivation layer on the second semiconductor layer; and
      an upper gate electrode on the passivation layer.

8. The display device of claim 7, wherein the first semiconductor layer and the second semiconductor layer comprise a same material or different materials from each other.

9. The display device of claim 8, wherein the first semiconductor layer and the second semiconductor layer comprise at least one material selected from: amorphous silicon, an oxide semiconductor, a nitride semiconductor, and an oxynitride semiconductor.

10. The display device of claim 7, wherein the upper gate electrode overlaps at least a portion of the source electrode and at least a portion of the drain electrode.

11. The display device of claim 7, wherein the upper gate electrode includes at least one of a metal, metal oxide, polysilicon, a conductive polymer, and a combination thereof.

12. The display device of claim 11, wherein the upper gate electrode is a transparent conductive electrode.

* * * * *